(12) United States Patent
Best

(10) Patent No.: US 6,373,293 B1
(45) Date of Patent: Apr. 16, 2002

(54) SELF-SYNCHRONIZED, MULTI-SAMPLE, QUADRATURE PHASE DETECTOR

(75) Inventor: Scott C. Best, Palo Alto, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 09/679,197

(22) Filed: Oct. 2, 2000

(51) Int. Cl.[7] .................................................. H03D 9/00

(52) U.S. Cl. ............................................. 327/2; 327/12

(58) Field of Search ............................ 327/2, 3, 8, 10, 327/12, 231, 256, 257, 156

(56) References Cited

U.S. PATENT DOCUMENTS

| | | | |
|---|---|---|---|
| 5,614,855 A | 3/1997 | Lee et al. ................... 327/158 |
| 5,727,037 A | 3/1998 | Maneatis .................... 375/376 |
| 5,825,209 A | 10/1998 | Stark et al. .................... 327/3 |
| 5,986,486 A | * 11/1999 | Nichols ....................... 327/156 |
| 6,014,042 A | 1/2000 | Nguyen .......................... 327/3 |
| 6,058,152 A | 5/2000 | Tanishima .................. 375/376 |
| 6,111,445 A | * 8/2000 | Zerbe et al. ................. 327/257 |
| 6,118,730 A | * 9/2000 | Kubo et al. ..................... 327/2 |

FOREIGN PATENT DOCUMENTS

WO     WO 99/62217     12/1999

OTHER PUBLICATIONS

Hui Wang, Richard Nottenberg, "A Gb/s CMOS Clock and Data Recovery Circuit," 1999 IEEE International Solid–State Circuits Conference.

\* cited by examiner

*Primary Examiner*—Tuan T. Lam
*Assistant Examiner*—Linh Nguyen
(74) *Attorney, Agent, or Firm*—Mark Lauer

(57) ABSTRACT

Phase detection circuitry is disclosed that can detect phase differences from a quadrature phase relationship, without requiring extensive additional circuitry for driving and correcting the phase detection circuitry. The phase detection circuitry can measure plural or multiple pulse durations consecutively, without interruption to reset the circuit or store the values generated by the circuit, affording a much higher sampling rate and sampling a higher proportion of pulses than is conventional. Averaging of the phase data samples is also provided by measuring multiple pulses, so that phase changes are not instigated based upon a signal from an individual pulse duration that may differ significantly from the average. In addition to detecting quadrature phase relationships, the phase detection circuitry can be adjusted to compensate for a desired offset in one of the signals from quadrature, or can be set to detect other phase relationships. The phase detection circuitry can also be configured to automatically adjust for variations in temperature, voltage and processing conditions, and has a number of advantages for use with high-frequency, low-voltage signals.

26 Claims, 3 Drawing Sheets

SELF-SYNCHRONIZED, MULTI-SAMPLE, QUADRATURE PHASE DETECTOR

BACKGROUND

The present invention relates to phase detectors, phase-locked loops, and delay-locked loops.

Phase detectors, which detect a phase relationship between plural signals, may be found in various systems, including communications systems, computers, and memory devices. Phase detectors may be used, for example, to synchronize signals for data transmission or reception by detecting relative phases of signals so that the phases can be adjusted to achieve a desired result. Phase detectors are commonly used, for example, as a part of a phase-locked loop (PLL) or delay-locked loop (DLL). Both PLLs and DLLs generally offer the ability to delay the phase of a signal by an amount that may be in a range between 0° and 360°. Typically, PLLs are employed to recover a clock signal or to multiply a signal from a slow frequency to a high frequency, whereas DLLs are used for precise alignment of signals.

A first type of phase detector may be called a zero phase detector, and simply detects and reports whether one signal was early or late compared to another. This can be made with a fairly straightforward circuit, for the phase difference is merely a function of the relative position of the edges of the signals, and is largely independent of the frequency of oscillation.

For high-frequency, low-voltage or high-noise signals, it may be desirable to detect a signal at the midpoint of another signal, rather than attempting to align edges for detection. A quadrature phase detector (QPD) attempts to detect a phase difference between a midpoint of one signal and an edge of another. Stated differently, a QPD detects whether two signals are 90° out of phase with each other, and if not, the relative variance of the signals from that 90° phase relationship. A challenge in designing a QPD is that aligning an edge of one pulse with the midpoint of another pulse implies some processing of pulse duration or frequency in order to determine that midpoint. Determining a pulse midpoint becomes more difficult with increasing signal frequency and reduced pulse voltage levels.

A prior art QPD circuit is shown in FIG. 1, and clock signals C and D, whose phases are being compared by the QPD, are shown in FIG. 2. The QPD includes a first current source 20 that provides charge to a first capacitor 22 during a time when signal C is high and signal D is low, such as period T1. The amount of charge that has built up on capacitor 22 results in a voltage on that capacitor that is an indication of the duration of period T1. A switch 25 can then be closed to reset the voltage across capacitor 22 to zero volts, so that charge build up on the capacitor can be used again to measure the duration of other periods when signal C is high and signal D is low. Similarly, current source 30 provides charge onto a capacitor 33 during a time when signal C is high and signal D is also high, for example period T2. The voltage that has built up on capacitor 33 is thus an indication of the duration of period T2. A switch 35 can then reset the voltage across capacitor 33 to zero volts, so that the charge build up on the capacitor can be used again to measure the relative duration of other times when both signals C and D are high. A comparator 40 has inputs connected to capacitor 22 and capacitor 33 for determining whether time T1 is greater or less than time period T2, and adjusts the phase of C or D accordingly to attempt to make later pulses have a quadrature phase relationship, which is again measured at times T3 and T4.

In order to operate the QPD, the frequency of signal C is divided by three, to produce signal C/3, which is then compared with signal C to generate signals R, I and S. Reset signal R is high for a time during which the switches 25 and 35 are closed to dissipate any charge on capacitors 22 and 33. While integration signal I is high, the switches are open and charge is allowed to build up on capacitors 22 and 33. While set signal S is high, the voltage on capacitors 22 and 33 is compared and stored for adjusting the phase.

A disadvantage of the mechanism shown in FIG. 1 and FIG. 2 is that a phase correction signal is created after looking at only a single pulse cycle, which can cause jitter or oscillations about a desired phase unless additional circuitry is provided for smoothing the shift in phase. Further circuitry is also needed to produce signals R, I and S, and this circuitry also requires additional chip real estate and adds potential sources of error. Moreover, the duration of an individual pulse, such as the time when signal C is high represented by adding T1 and T2, may vary significantly from average, which can cause incorrect adjustments of phase. For high-frequency, low-voltage, or high-noise conditions, or for situations in which the signals being compared differ from perfect square waves, variations of individual pulses from average may be especially pronounced. Further, the phase alignment is only sampled during one-third of the pulses, with the other pulses used for resetting the circuit and measuring or storing the output, thereby ignoring a majority of the data available for phase detection.

SUMMARY

In accordance with the present invention, phase detection circuitry is disclosed that can detect phase differences from a quadrature phase relationship, without the need for extensive additional circuitry for driving and correcting the phase detection circuitry. Such circuitry can measure plural or multiple pulse durations consecutively, without interruption to reset the circuit or store the values generated by the circuit, affording a much higher sampling rate and sampling a higher proportion of pulses than is conventional. Averaging of the phase data samples is also provided by measuring multiple pulses, so that phase changes are not instigated based upon a signal from an individual sample that may differ significantly from the average. In addition to detecting quadrature phase relationships, the phase detection circuitry can be adjusted to compensate for a desired offset in one of the signals from quadrature, or can be set to detect other phase relationships. The phase detection circuitry can also be configured to automatically adjust for variations in temperature, voltage and processing conditions. Each of these attributes is useful for high-frequency, low-voltage, or high-noise signals, so that the phase detection circuitry has a number of advantages for use with such signals, but is by no means limited by this brief summary of possible features.

DESCRIPTION OF THE PREFERRED EMBODIMENT

Figure 3:
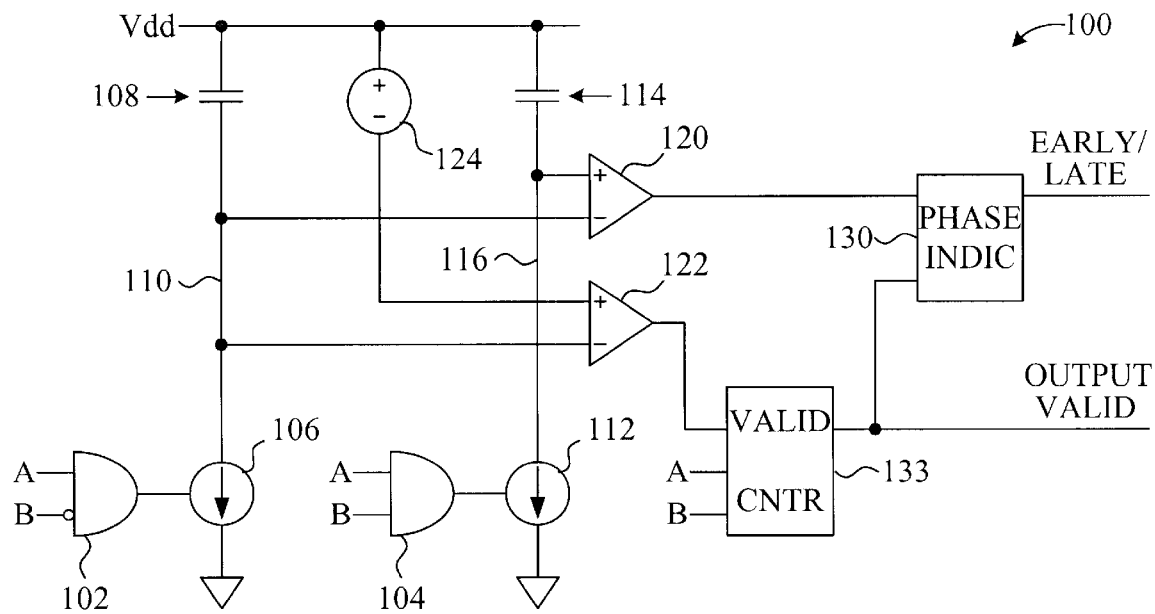
FIG. 3 is a diagram of a phase detector in accordance with the present invention.
Figure 4:
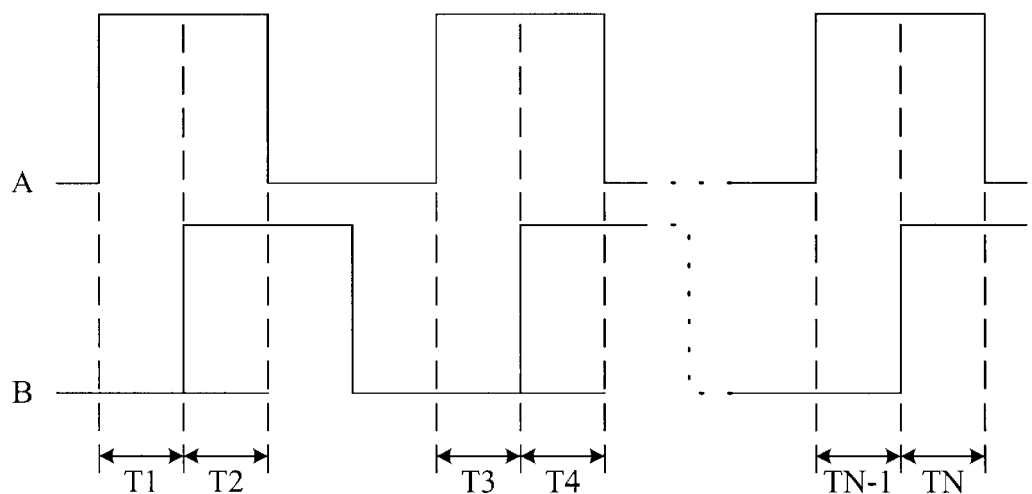
FIG. 4 is a plot of signals that may be used in the phase detector of FIG. 3, in accordance with the present invention.

FIG. 3 shows an embodiment of a phase detector 100 in accordance with the present invention that receives signals A and B, which are shown as idealized square waves in FIG. 4. In operation, signals A and B may differ markedly from that shown in FIG. 4, due to the generation of different forms of signals, noise or other factors. Phase detector 100 includes logic gates 102 and 104, which in this embodiment are shown to be AND gates, although other logic gates may instead be employed. In other embodiments, the input signals A and B may have more sinusoidal or other non-digital characteristics. In such other embodiments, the logic gates 102 and 104 may be replaced by circuitry that controls the current sources such that: one current source is turned on when the voltage levels of signals A and B are substantially similar (e.g. both are greater than a certain high voltage threshold in one embodiment or both are less than a predetermined low voltage threshold in another embodiment); and the other current source is turned on when the voltage levels of signals A and B are substantially different (e.g. signal A is greater than the high voltage threshold and signal B is less than the low voltage threshold in one case and signal A is less than the low voltage threshold and signal B is greater than the high voltage threshold in another case).

In the embodiment illustrated, signals A and B may be clock signals and thus tend to have generally square wave-like characteristics. In such a case, the determination of substantially similar voltage levels is equivalent to detecting a matching logic state and the determination of substantially different voltage levels is equivalent to detecting a non-matching logic state. In the example illustrated, Gate 102 receives signal A at one input and includes a mechanism for receiving the complement of signal B at its other input. Gate 104 receives signal A at one input and signal B at its other input. Gate 102 controls a first current source 106 that is connected to a first capacitor 108 via a first integration line 110. Gate 104 controls a second current source 112 that is connected to a second capacitor 114 via a second integration line 116. Line 110 is connected to an input of a first comparator 120, and line 114 is connected to another input of comparator 120. A second comparator 122 has an input connected to line 110 and another input connected to a voltage source 124. Current sources 106 and 112 are substantially matched, as are capacitors 108 and 114, to provide accurate comparisons to the inputs of the comparators.

Figure 1:
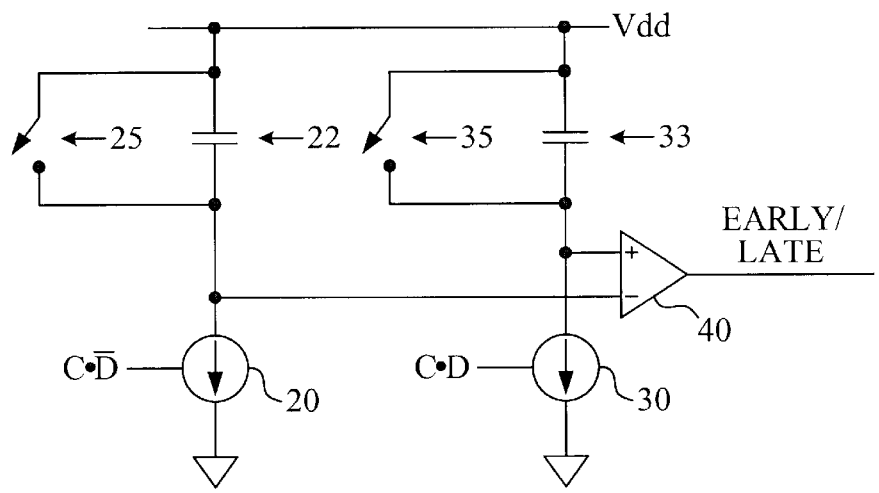
FIG. 1 is a diagram of a prior art phase detector that is used in conjunction with other circuitry to detect a phase difference between two signals.
Figure 2:
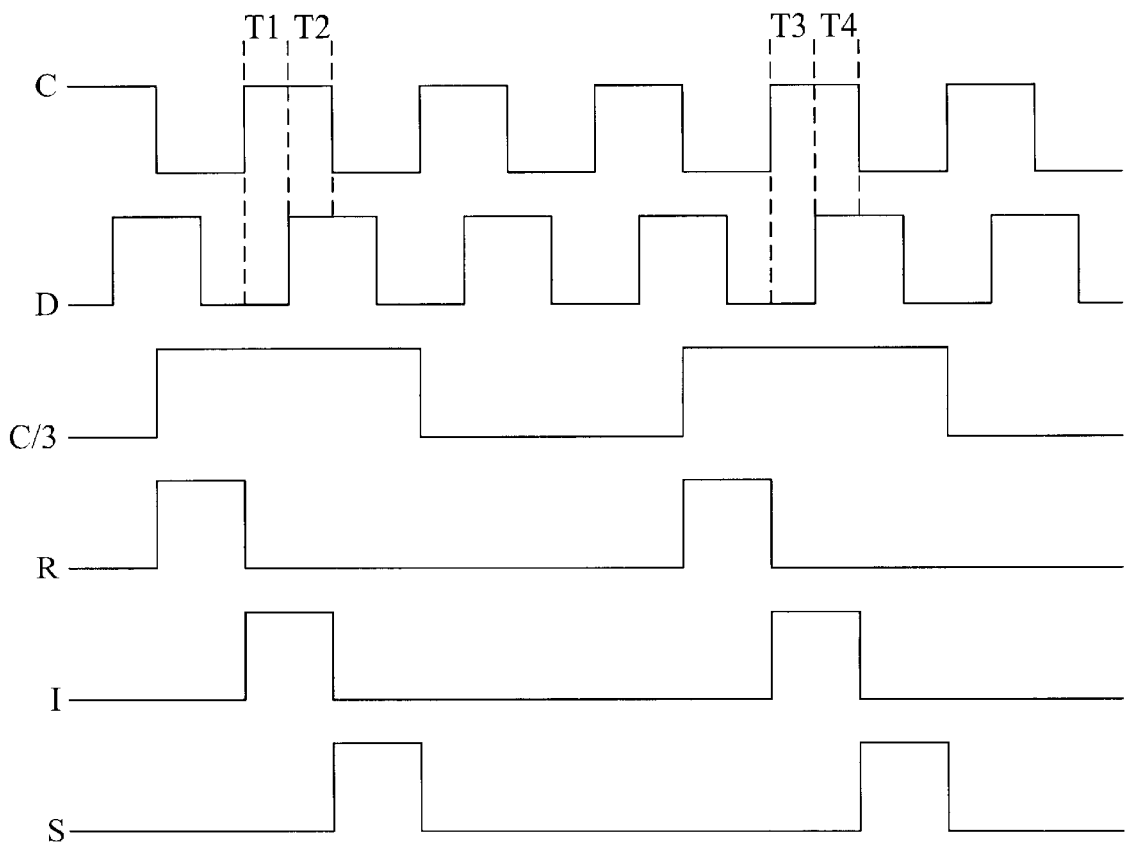
FIG. 2 is a plot of various signals that may be used in the phase detector of FIG. 1, including control signals generated by some of the other circuitry in order to run the phase detector of FIG. 1.

Logic gate 102 turns on current source 106 during time period T1, when signal A is high and signal B is low, causing charge to accumulate on capacitor 108. Similarly, logic gate 104 turns on current source 112 during time period T2, when signal A is high and signal B is also high, causing charge to accumulate on capacitor 114. Capacitors 108 and 114 are examples of integration mechanisms that may be employed for measuring voltage or current differences over time. Unlike the prior art, phase data is sampled again during the next cycle of signals A and B, during time periods T3 and T4, when charge again accrues on capacitors 108 and 114, respectively. Capacitors 108 and 114 maybe used to accumulate charge corresponding to a number N of time measurements before the comparator 120 compares the voltage level of capacitor 108 with that of capacitor 114. Based on the comparison, the comparator outputs a signal indicating which capacitor has a higher voltage level, which indicates whether T1 was greater or less than T2. Once the comparison has been performed, the charge on the capacitors may be dissipated for a subsequent integration and comparison operation. The charge dissipation may be accomplished using switches across the capacitors similar to those shown in FIG. 1.

Integrating charge over a number of measurement periods can increase the accuracy of the determination made by comparator 120. For example, the charge accumulated during a single measurement period such as T1 or T2 may be a few millivolts, which may be less than a minimum voltage needed by comparator 120 to make an accurate comparison. By storing a sum of the charge stored during multiple periods for comparison, moreover, capacitors 108 and 114 offer an averaged value that is less subject to jitter or minor variations.

Voltage source 124 provides a reference threshold that ensures that enough voltage has accrued on capacitors 108 and 114 for an accurate measurement by comparator 120. The reference threshold may be adjustable such that it can respond to changes in operating conditions or to a desired threshold that may be configurable based on a register setting. When the voltage on line 110 passes the threshold established by voltage source 124, indicating that phase data from a number of time measurements has accrued, comparator 122 switches on, providing a signal to a validity checker 133 that a phase sample is ready for measurement. Because the comparison should be performed when the number of periods that add charge to capacitor 108 is equal to the number of periods that add charge to capacitor 114, the validity checker 133 also includes circuitry that detects this condition and generates a resulting control signal. The circuitry that performs this function may include a counter that determines whether an even number of time measurements has occurred, so that the number of measurements for which A was high and B was low is equal to the number of measurements for which A and B were both high. In other embodiments, the circuitry may simply include a flip-flop that determines whether the number of time measurements performed thus far is odd or even (if the number of measurements is odd, the number used to add charge to one capacitor cannot equal the number used to add charge to the other).

When the comparator 122 indicates that the voltage across capacitor 108 has reached or exceeds the threshold set by voltage source 124, and the it has been determined that an even or predetermined number of time measurements has occurred, an output valid signal is sent to phase indicator 130. The phase detector 130 also receives a signal from comparator 120 indicating whether capacitor 108 or capacitor 114 has more voltage. Upon receiving the output valid signal, phase indicator 130 outputs the signal from comparator 120 indicating whether signal B is early or late compared to the quadrature of signal A. This signal may be provided to a conventional digital to analog converter (DAC) that controls a phase adjusting mechanism for adjusting the phase of signal B accordingly. An example of such a phase adjusting mechanism is disclosed in U.S. Pat. No. 5,614,855 to Lee et al., entitled "Delay-Locked Loop," and incorporated by reference herein. The output valid signal that triggers comparison of the voltages across capacitors 108 and 114 may also be used to control switches, not shown in this figure, that reset the voltages across the capacitors 108 and 110 such that that the capacitors 108 and 110 may begin accumulating phase data for another set of time periods.

Note that the phase detector 100 essentially measures a leading edge of pulses for signals A and B, as these edges may be subject to less noise than the trailing edges of those pulses. Straightforward modifications to the logic gates may be made to create a phase detector that instead measures the trailing edges of the pulses. Also note that other forms of signals may be measured for phase relationships. For example, with appropriate settings of logic thresholds, relative phases of sinusoidal signals can be compared with phase detector 100. The phase detector also can be adjusted to align the relative phases in a non-quadrature relationship, for example by providing unequal current sources 106 and 112. Aligning the relative phases in a non-quadrature relationship may be useful, for instance, when one of the signals is known to encounter a delay relative to the other signal, so that after encountering the delay the signals are in quadrature. Similarly, an adjustment from quadrature can be provided by setting the validity checker 133 to output a valid signal when an odd instead of an even number N of time measurements has occurred. It is also possible to employ phase detector 100 to compare phases of signals having different frequencies, for example where one frequency is twice the other.

Also, circuit elements 102 and 104 need not be logic gates in a strict sense. In a more general sense various circuit elements that regulate the current of lines 110 and 116 can be employed as charge pumps for capacitors 108 and 114, respectively. Such circuit elements can be found, for example, in emitter-coupled logic (ECL) families that work with signals that swing relative to each other, and analogous complimentary metal-oxide semiconductor (CMOS) differential signal families, such as low voltage differential signal (LVDS) logic families. The circuit elements may be for instance differential amplifiers or other devices that compare input signals. And depending upon the type of device, a threshold for delineating whether input signals such as voltage levels are high or low, and whether plural signals are substantially similar or substantially different, may be arbitrarily set. Thus any charge pump employing an output signal resulting from a logical combination of input signals to control a current source may be implemented according to the present invention.

As stated above, the output valid signal may be used to reset the capacitors 108 and 114 for comparing phase data from another series of pulses of signals A and B. The phase indication signal may also be made available to other related elements. For instance, an early or late phase indication may correlate with process, voltage and/or temperature (PVT) conditions throughout an integrated circuit (IC) that includes the phase detector 100. In this case, the early or late phase indication may be employed for controlling automatic voltage, current or gain control mechanisms in other areas of the IC.

Figure 5:
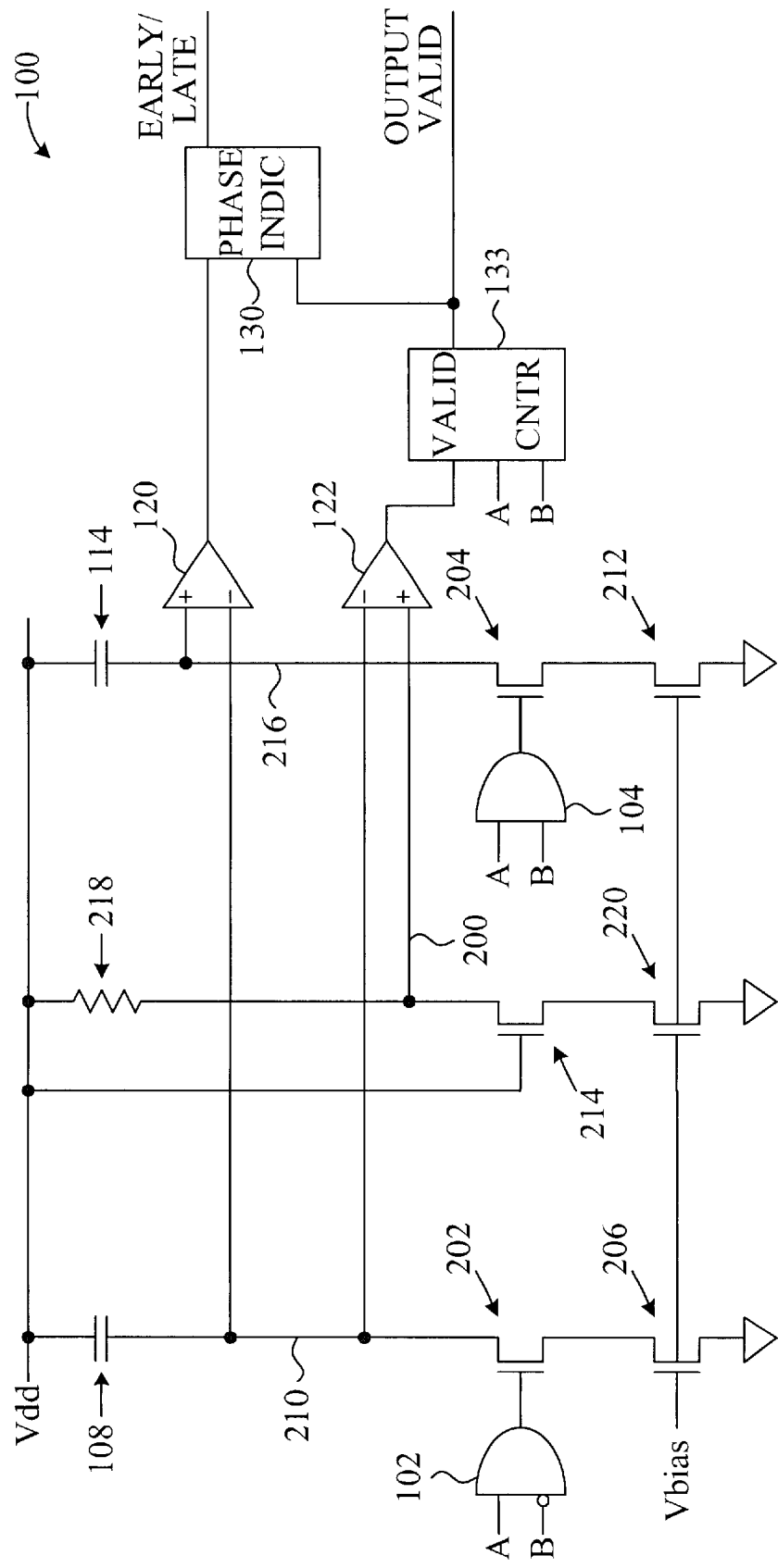
FIG. 5 is a diagram of a phase detector in accordance with the present invention including a reference voltage compensation mechanism.

The voltage source 124 may be a simple voltage divider that sets the voltage input to comparator 122 at a predetermined level less than Vdd. On the other hand, as shown in FIG. 5, the voltage level of a reference input 200 to comparator 122 can be configured to respond to PVT conditions in a similar manner as current sources 206 and 212 for integration lines 210 and 216. In this case, transistors 214 and 220 and resistor 218 form a reference-voltage generator which utilizes a current source that matches the current sources uses to generate the integration currents. Transistors 202 and 204 are turned on and off by the output of gates 102 and 104, respectively, to accrue charge on capacitors 108 and 114 reflecting the phase relationship of signals A and B. A bias voltage Vbias that may relate to various factors such as PVT conditions controls current sources 206 and 212. The current source 220 is controlled by the same bias signal Vbias, so that the voltage on line 200 can vary, for instance due to PVT conditions, in a similar fashion as the charge accruing on capacitors 108 and 114 may vary.

Although this disclosure has focused on teaching the preferred embodiments of a novel phase detector, other embodiments and modifications of this invention will be apparent to persons of ordinary skill in the art in view of these teachings. Therefore, this invention is limited only by the following claims, which include all such embodiments and modifications when viewed in conjunction with the above specification and accompanying drawings.

What is claimed is:

1. A device for detecting a difference in phase between first and second signals, the device comprising:

a first integration line including a first current source connected to a first capacitor, a second integration line including a second current source connected to a second capacitor, a first circuit element having inputs to receive the first and second signals and an output operably coupled to and regulating said first current source, a second circuit element having inputs to receive the first and second signals and an output operably coupled to and regulating said second current source, a first comparator having a first input connected to said first integration line and having a second input connected to said second integration line, and a second comparator having a first input connected to said first integration line and having a second input connected to a reference voltage, such that an output from said first comparator indicates a phase difference between said signals, and an output from said second comparator indicates that a sufficient voltage is present at said inputs to said first comparator to measure said phase difference.

2. The device of claim 1, further comprising a counting mechanism operably coupled to said second comparator, said counting mechanism determining whether a number of periods corresponding to the first signal is equal to a number of periods of the second signal.

3. The device of claim 1, wherein said output from said second comparator indicates a number of periods of the first or second signals from which said phase difference has been determined.

4. The device of claim 1, wherein said reference voltage is configurable.

5. The device of claim 1, wherein said circuit elements are logic gates.

6. The device of claim 1, wherein said circuit elements are AND gates, and one of said AND gates includes a mechanism to invert one of said first and second signals.

7. The device of claim 1, further comprising a mechanism to transmit said output from said first comparator based on said output from said second comparator.

8. A device for detecting a difference in phase between first and second signals, the device comprising:

a first integration mechanism configured to integrate a first plurality of time periods over which said first and second signals have substantially similar voltage levels, and thereby obtain a first sum, a second integration mechanism configured to integrate a second plurality of time periods over which said first and second signals have substantially different voltage levels, and thereby obtain a second sum, wherein individual periods of said second plurality of time periods alternate with individual periods of said first plurality of time periods, a comparison mechanism operably coupled to said first and second integration mechanisms to compare said first sum and said second sum and produce an indication of a phase relationship between the signals, and a validation mechanism operably coupled to said comparison mechanism to regulate an output of said indication, whereby said output is transmitted when said comparison mechanism is operable to accurately compare said first sum and said second sum.

9. The device of claim 8, wherein said validation mechanism includes an apparatus to compare at least one of said sums with a reference threshold.

10. The device of claim 8, wherein said validation mechanism includes an apparatus to determine whether said first and second pluralities are of equal number.

11. The device of claim 8, wherein said validation mechanism includes an apparatus to compensate for variables in operating conditions that affect said sums.

12. The device of claim 8, wherein said integration mechanisms each include a current source connected to a capacitor and controlled by a circuit element to receive the signals.

13. The device of claim 8, wherein said integration mechanisms each include a current source connected to a capacitor and controlled by a logic gate to receive the signals.

14. The device of claim 8, wherein said integration mechanisms each include a charge pump.

15. The device of claim 8, wherein the first and second signals have substantially similar voltage levels when both the first and second signals are at a first logic level, and wherein the first and second signals have substantially different voltage levels when the first signal is at the first logic level and when the second signal is at a second logic level.

16. A device for detecting a difference in phase between first and second signals, said first and second signals each varying about at least one threshold between high and low values, the device comprising:

means for measuring a first plurality of time periods during which both of the signals have substantially the same value of the high and low values, and integrating said first plurality of time periods to obtain a first overall time indication, means for measuring a second plurality of time periods during which one of the signals has said high value and the other of the signals has said low value and integrating said second plurality of time periods to obtain a second overall time indication, wherein individual periods of said second plurality of time periods alternate with individual periods of said first plurality of time periods, means for comparing said overall time indications to determine a phase difference between the first and second signals, said means for comparing operably coupled to said means for measuring said first plurality of time periods and operably coupled to said means for measuring said second plurality of time periods, and means for determining that more than two of said individual periods has occurred.

17. The device of claim 16, further comprising means for determining whether said first and second plurality of time periods are of equal number operably coupled to said means for comparing said overall time indications, wherein the means for comparing performs the comparison based on a determination as to whether said first and second plurality of time periods are of equal number.

18. The device of claim 16, further comprising means for determining if at least one of said overall time indications compares favorably with a reference threshold wherein the means for comparing performs the comparison based on whether a favorable comparison is determined.

19. The device of claim 18, further comprising means for adjusting said reference threshold.

20. A method for detecting a phase difference, the method comprising:

providing a first signal oscillating at a first frequency and a second signal oscillating at a second frequency, measuring a first plurality of time periods during which both of said signals have a substantially similar voltage level, and integrating said first plurality of time periods to obtain a first overall time indication, measuring a second plurality of time periods during which said signals have substantially different voltage levels, wherein individual periods of said second plurality of time periods alternate with individual periods of said first plurality of time periods, and integrating said second plurality of time periods to obtain a second overall time indication, and comparing said overall time indications to determine a phase difference between said first and second signals.

21. The method of claim 20, further comprising outputting an indication of the phase difference when at least one of said overall time indications compares favorably with a reference threshold.

22. The method of claim 21, further comprising controlling said reference threshold with a bias signal and controlling said integrating of said first and second time periods with said bias signal.

23. The method of claim 20, further comprises outputting an indication of the phase difference when said first plurality of time periods is equal to said second plurality of time periods.

24. The method of claim 23, wherein determining that said first plurality of time periods is equal to said second plurality of time periods further comprises:

counting said first and second pluralities of time periods, and determining whether said first plurality of time periods is equal to said second plurality of time periods.

25. The method of claim 20, wherein said first and second frequencies are substantially identical.

26. The method of claim 20, wherein the first and second signals have substantially similar voltage levels when both the first and second signals are at a first logic level, and wherein the first and second signals have substantially different voltage levels when the first signal is at the first logic level and when the second signal is at a second logic level.

* * * * *